United States Patent
Zhu

(10) Patent No.: US 10,250,272 B2
(45) Date of Patent: Apr. 2, 2019

(54) LOCALIZED DYNAMIC ELEMENT MATCHING AND DYNAMIC NOISE SCALING IN DIGITAL-TO-ANALOG CONVERTERS (DACS)

(71) Applicant: MaxLinear, Inc., Carlsbad, CA (US)

(72) Inventor: Jianyu Zhu, San Diego, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 15/681,857

(22) Filed: Aug. 21, 2017

(65) Prior Publication Data

US 2018/0091164 A1    Mar. 29, 2018

Related U.S. Application Data

(63) Continuation of application No. 15/213,731, filed on Jul. 19, 2016, now Pat. No. 9,742,421, which is a continuation of application No. 14/821,353, filed on Aug. 7, 2015, now Pat. No. 9,397,678, which is a continuation of application No. 14/458,439, filed on Aug. 13, 2014, now Pat. No. 9,106,244.

(60) Provisional application No. 61/866,011, filed on Aug. 14, 2013, provisional application No. 61/866,123, filed on Aug. 15, 2013.

(51) Int. Cl.
| | |
|---|---|
| H03M 1/06 | (2006.01) |
| H03M 1/08 | (2006.01) |
| H03M 1/74 | (2006.01) |
| H03M 1/66 | (2006.01) |

(52) U.S. Cl.
CPC ............ *H03M 1/08* (2013.01); *H03M 1/066* (2013.01); *H03M 1/0617* (2013.01); *H03M 1/66* (2013.01); *H03M 1/74* (2013.01)

(58) Field of Classification Search
CPC .... H03M 1/66; H03M 2201/52; H03M 1/167; H03M 1/74
USPC .......................... 341/62, 156, 144, 118, 160
See application file for complete search history.

(56) References Cited

U.S. PATENT DOCUMENTS

| | | | | |
|---|---|---|---|---|
| 6,466,147 B1* | 10/2002 | Jensen | ................ | H03M 1/0673 341/143 |
| 6,816,103 B2* | 11/2004 | Jonsson | ................ | H03M 1/066 341/144 |
| 7,239,258 B2* | 7/2007 | Grosso | .................... | H03M 1/70 341/139 |

(Continued)

*Primary Examiner* — Jean B Jeanglaude
(74) *Attorney, Agent, or Firm* — McAndrews, Held & Malloy, Ld.

(57) ABSTRACT

A digital-to-analog converter (DAC) may have an encoder that generates a multi-bit output based on a multi-bit input, a plurality of first converter elements, with each first converter element generating an output according to a single bit of the multi-bit output of the encoder; and a combiner that generates a combined output based on combining outputs from the plurality of first converter elements. The number of bits in the multi-bit input being two or more and the number of bits in the multi-bit output being greater than the number of bits in the multi-bit input. The DAC may also have one or more second converter elements, with second converter element generating an output according to a single bit, and the combiner may generates the combined output based on combining outputs from the plurality of first converter elements with outputs from the one or more second converter elements.

12 Claims, 9 Drawing Sheets

(56) References Cited

U.S. PATENT DOCUMENTS

| | | | | |
|---|---|---|---|---|
| 7,304,593 B2* | 12/2007 | Luecking | ............ | H03M 1/0668 |
| | | | | 341/143 |
| 8,022,850 B2* | 9/2011 | Newman | ............ | H03M 1/0665 |
| | | | | 341/143 |
| 8,159,381 B2* | 4/2012 | Parida | ................ | H03M 7/12 |
| | | | | 341/118 |
| 8,311,506 B2* | 11/2012 | Rofougaran | ..... | G06K 19/07749 |
| | | | | 455/296 |
| 2004/0051657 A1* | 3/2004 | Jonsson | ............ | H03M 1/066 |
| | | | | 341/156 |
| 2011/0279292 A1* | 11/2011 | Parida | ................ | H03M 7/12 |
| | | | | 341/62 |

* cited by examiner

LOCALIZED DYNAMIC ELEMENT MATCHING AND DYNAMIC NOISE SCALING IN DIGITAL-TO-ANALOG CONVERTERS (DACS)

CLAIM OF PRIORITY

This patent application is a continuation of U.S. patent application Ser. No. 15/213,731 filed Jul. 19, 2016, which is a continuation of U.S. patent application Ser. No. 14/821, 353 filed Aug. 7, 2015, which is a continuation of U.S. patent application Ser. No. 14/458,439 filed Aug. 13, 2014, which in turn makes reference to, claims priority to and claims benefit from both U.S. Provisional Patent Application Ser. No. 61/866,011, filed Aug. 14, 2013, and U.S. Provisional Patent Application Ser. No. 61/866,123, filed on Aug. 15, 2013.

Each of the above identified applications is hereby incorporated herein by reference in its entirety.

TECHNICAL FIELD

Aspects of the present disclosure relate to signal processing. More specifically, certain implementations of the present disclosure relate to methods and systems for using localized dynamic element matching and/or dynamic noise scaling in digital-to-analog converters (DACs).

BACKGROUND

Existing methods and systems for performing digital-to-analog conversions may be inefficient. Further limitations and disadvantages of conventional and traditional approaches will become apparent to one of skill in the art, through comparison of such approaches with some aspects of the present method and apparatus set forth in the remainder of this disclosure with reference to the drawings.

BRIEF SUMMARY

A system and method is provided for using localized dynamic element matching and/or dynamic noise scaling in digital-to-analog converters (DACs), substantially as shown in and/or described in connection with at least one of the figures, as set forth more completely in the claims.

These and other advantages, aspects and novel features of the present disclosure, as well as details of illustrated implementation(s) thereof, will be more fully understood from the following description and drawings.

DETAILED DESCRIPTION

Certain example implementations may be found in method and system for using localized dynamic element matching and/or dynamic noise scaling in digital-to-analog converters (DACs). As utilized herein the terms "circuits" and "circuitry" refer to physical electronic components ("hardware") and any software and/or firmware ("code") which may configure the hardware, be executed by the hardware, and or otherwise be associated with the hardware. As used herein, for example, a particular processor and memory may comprise a first "circuit" when executing a first plurality of lines of code and may comprise a second "circuit" when executing a second plurality of lines of code. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the terms "block" and "module" refer to functions than can be performed by one or more circuits. As utilized herein, the term "example" means serving as a non-limiting example, instance, or illustration. As utilized herein, the terms "for example" and "e.g.," introduce a list of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
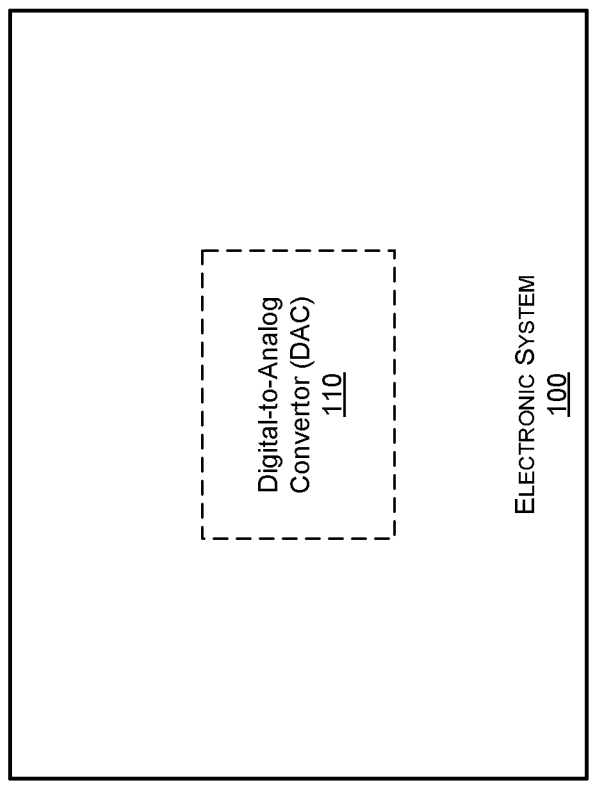
FIG. 1 illustrates an example electronic system that may be operable to perform digital-to-analog conversions.

FIG. 1 illustrates an example electronic system that may be operable to perform digital-to-analog conversions. Referring to FIG. 1, there is shown an electronic system 100.

The electronic system 100 may comprise suitable circuitry for implementing various aspects of the present disclosure. In this regard, the electronic system 100 may be configured to support performing, executing or running various operations, functions, applications and/or services. The electronic system 100 may be used, for example, in executing computer programs, playing video and/or audio content, gaming, performing communication applications or services (e.g., Internet access and/or browsing, email, text messaging, chatting and/or voice calling services), providing networking services (e.g., WiFi hotspot, Bluetooth piconet, Ethernet networking, cable or satellite systems, and/or active 4G/3G/femtocell data channels), or the like.

In some instances, the electronic system 100 may enable and/or support communication of data. In this regard, the electronic system 100 may need to communicate with other systems (local or remote), such as during executing, running, and/or performing of operations, functions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted and/or received signals in accordance with applicable wired or wireless protocols.

Examples of wireless protocols or standards that may be supported and/or used by the communication subsystem 250 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+ (e.g., GSM/GPRS/EDGE, and IS-95 or cdmaOne) and/or 2G/2G+ (e.g., CDMA2000, UMTS, and HSPA); 4G standards, such as WiMAX (IEEE 802.16) and LTE; Ultra-Wideband (UWB), and/or the like. Examples of wired protocols and/or interfaces that may be supported and/or used by the communication subsystem 250 comprise Ethernet (IEEE 802.3), Fiber Distributed Data Interface (FDDI), Integrated Services Digital Network (ISDN), cable television and/or internet (ATSC, DVB-C, DOCSIS), and Universal Serial Bus (USB) based interfaces. Examples of signal processing operations that may be performed by the electronic system 100 comprise, for example, filtering, amplification, analog-to-digital conversion and/or digital-to-analog conversion, up-conversion/down-conversion of baseband signals, encoding/decoding, encryption/decryption, and/or modulation/demodulation.

In some instances, the electronic system 100 may be configured to enable or support input/output operations, such as to allow providing output to and/or obtaining input from user(s) of the electronic system 100. In this regard, the electronic system 100 may comprise components or subsystems for enabling obtaining user input and/or to provide output to the user. For example, the electronic system 100 may be operable to support audio output operations, whereby acoustic signals may be generated and/or outputted via suitable output devices (e.g., loudspeakers). In this regard, the output signals may be generated based on content, which may be in digital form (e.g., digitally formatted music or the like).

Examples of electronic systems may comprise handheld electronic devices (e.g., cellular phones, smartphones, or tablets), personal computers (e.g., laptops or desktops), servers, dedicated media devices (e.g., televisions, game consoles, or portable media players, etc.), set-top boxes (STBs) or other similar receiver systems (e.g., satellite receivers), and the like. The disclosure, however, is not limited to any particular type of electronic system.

In operation, the electronic system 100 may be operable to perform various operations, functions, applications and/or services. For example, in some instances, electronic system 100 may be configured or used to communicate data (to and/or from the system), and to process the communicated data. Communication of data, whether over wired or wireless interfaces, may typically comprise transmitting and/or receiving analog signals that are communicated over wireless and/or wired connections. In this regard, analog radio frequency (RF) signals may be used to carry data (e.g., content), with the data being embedded into the analog signals in accordance with particular analog or digital modulation schemes. For analog communications, data is transferred using continuously varying analog signals, and for digital communications, the analog signals are used to transfer discrete messages in accordance with a particular digitalization scheme. Thus, handling of digital communications (e.g., in the electronic system 100) may typically require performing, inter alia, digital-to-analog conversions on the transmitter-end and analog-to-digital conversions at the receiver-end.

Digital-to-analog conversions (and analog-to-digital conversions) may also be performed in the electronic system 100 during other (non-communicative) operations. For example, during audio/video related operations, audio/video content that is typically formatted in digital form may be processed to generate corresponding analog audio or video signals during output operations, and captured audio and/or video analog signals may be processed, to generate the digital audio/video content. That processing may comprise performing digital-to-analog conversions (e.g., during output operations) and/or analog-to-digital conversions (e.g., during input operations).

Accordingly, the electronic system 100 may incorporate suitable components for providing digital-to-analog conversions and/or analog-to-digital conversions. For example, the electronic system 100 may comprise one or more digital-to-analog converters (DACs) 110. Each DAC 110 may comprise suitable circuitry for performing digital-to-analog conversions. The DACs 110 may be utilized, e.g., during signal processing, such as to allow converting digital data into analog waveforms (e.g., corresponding to and/or being embedded into acoustic signals, radio frequency (RF) signals, etc.). The disclosure, however, is not limited to any particular use scenario, and may be utilized in any appropriate setup performing or requiring digital-to-analog conversions.

Various architectures and/or designs may be used with respect performing digital-to-analog conversions and/or implementing digital-to-analog converters (DACs). For example, DACs may be implemented based on current-steering. In this regard, in current-steering DACs, the conversion from digital to analog may be performed based on steering of current from sources, with the steering being controlled or adjusted based on the input digital code. An example implementation of current-steering DAC is described in more detail with respect to FIG. 4.

Further, DACs may incorporate use of various techniques for addressing particular issues that may exist in DACs. For example, in some instances, DACs may incorporate use of dynamic element matching (DEM). In this regard, dynamic element matching may be used in DACs to attempt to address mismatch errors, which may result, for example, from differences between actual values and ideal/expected values. Such mismatch errors, if not addressed, may otherwise cause conversion errors. For example, the mismatch errors may be addressed in the DAC by using dynamic element matching to enable scrambling these mismatch errors, to prevent them from forming spurious tones or distortions at the DAC output. An example implementation of a DAC incorporating use of dynamic element matching (DEM) is described in more detail with respect to FIG. 2.

Figure 2:
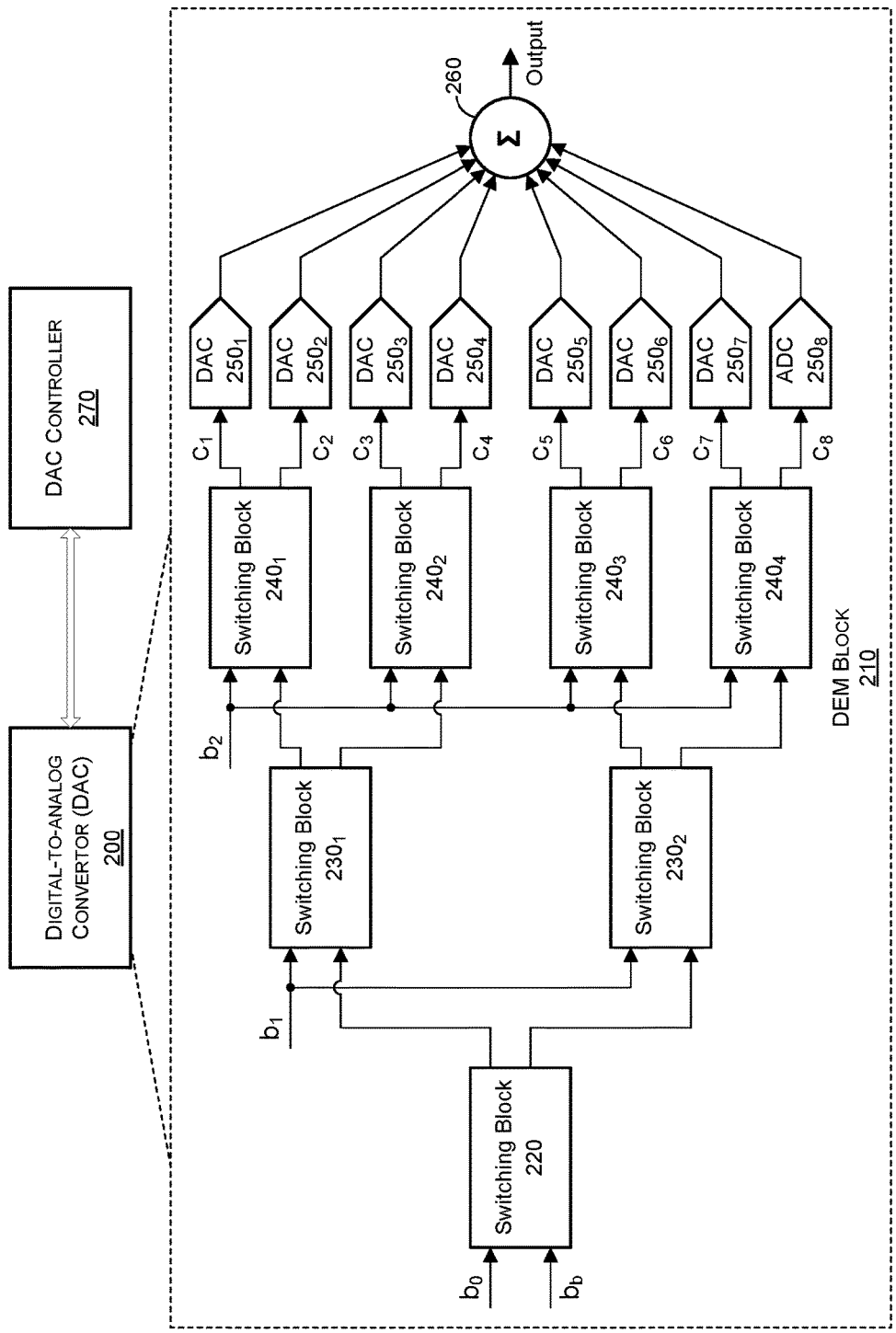
FIG. 2 illustrates an example tree-structured dynamic element matching (DEM) block, for use in digital-to-analog converters (DACs).

FIG. 2 illustrates an example tree-structured dynamic element matching (DEM) block, for use in digital-to-analog converters (DACs). Referring to FIG. 2, there is shown a digital-to-analog convertor (DAC) 200.

The DAC 200 may comprise suitable circuitry for performing digital-to-analog conversions. The DAC 200 may correspond to, for example, the DAC 100, substantially as described with respect to FIG. 1. In this regard, the DAC 200 may be utilized, for example, during signal processing, such as to allow converting digital data into analog waveforms. The disclosure, however, is not limited to any particular use scenario, and may be utilized in any appropriate setup performing or requiring digital-to-analog conversions. As noted above, various designs, architectures, and/or implementations may be used in digital-to-analog conversions and/or in digital-to-analog converters (DACs), including dynamic element matching (DEM).

For example, in the example implementation depicted in FIG. 2, the DAC 200 may comprise one or more of DEM block(s) 210, with each DEM block 210 comprising suitable circuitry for performing dynamic element matching. The DEM block 210 may comprise, for example, a plurality of equally-weighted DAC elements $250_1$ through $250_N$ (e.g., DAC elements $250_1$ through $250_8$ in the example implementation shown in FIG. 2) and an adder 260, for combining the outputs of the DAC elements $250_1$-$250_N$. The DEM block 210 may also comprise an 'encoder' portion, which may comprise suitable circuitry for controlling turning on/off of the DAC elements $250_1$-$250_N$, such as based on the input(s) to the DEM block 210. In this regard, the input to the DEM block 210 may be the digital code being converted to corresponding analog output via the DAC 200.

For example, the encoder portion of the DEM block 210 may comprise one or more switching blocks, with each switching block being configured to perform a particular switching sequence, based on inputs to the switching block. The number and/or arrangement of switching blocks may be based on the particular scheme used and/or applied by the DEM block, as described in more details below.

Dynamic element matching (DEM) may be used in DACs, incorporating a plurality of DAC elements (each performing digital-to-analog conversion, such as in accordance with single bit in a multi-bit digital input), as an effective technique for improving linearity and spurious-free dynamic range (SFDR) in DACs. The use of DEM may enable scrambling errors arising from DAC element mismatches (static or dynamic), such as into white or shaped noise, so that these errors would not contribute to nonlinear distortions in the DAC output. However, DEM does not remove the mismatch error from the DAC output. Therefore, while DEM may result in improving the SFDR (as result of scrambling the error(s)), use of DEM may not result in improving signal to noise-plus-distortion ratio (SNDR). In this regard, DACs employing DEM may be expected to have similar SNDR as DACs without DEM (e.g., using a pure thermometer encoder) for full-scale input signals (e.g., a single-tone sine wave with 0 dBFS swing), and may even have worse SNDR for input signals not at full-scale. The reason may be that when an input signal is backed off from full-scale, not all the DAC elements are needed to generate the desired output, so the mismatch error from the unused DAC elements may become DC component at the DAC output and thus does not degrade SNDR, whereas DEM scrambles all the DAC elements regardless of the input signal amplitude, hence mismatch error(s) from the all the DAC elements may be present at the DAC output and result in worse SNDR.

Accordingly, in various implementations in accordance with the present disclosure, dynamic element matching performed in DACs (e.g., in the DAC 200, such as in the DEM block 210) may be configured and/or implemented in a manner that may represent an enhancement to the existing DEM schemes, such as to solve the problem(s) described above. In a particular example implementation, a localized dynamic element matching scheme may be used, whereby only some of the DAC elements may be selectively used. For example, the DEM block 210 may be configured such that, at least in some instances, some of the DAC elements $250_1$-$250_N$ may not be switched when the input is backed off from full-scale, while it still scrambles the remaining DAC elements so that their mismatch does not lead to nonlinear distortion. The resultant scheme may be a localized DEM that only scrambles the DAC elements that are needed to generate the desired DAC output, which improves SFDR and at the same time does not degrade SNDR.

The scheme may be particularly configured based on the characteristics of the DAC. For example, where the DAC incorporates a particular switching arrangement (e.g., within the DEM block 210) for driving the DAC elements, the scheme may be configured to control the components of the switching arrangements. Further, in some instances, dedicated control logic may be used for providing the necessary adjustments compared to traditional DEM operations. For example, a DAC controller 270 may be used to store information relating to the improved DEM schemes, and/or to provide any adjustments (e.g., via control signals) and/or information required for effectuating the changes in accordance with the particular scheme(s) being applied.

The DAC controller 270 may comprise suitable circuitry for providing needed storage, processing, and/or interactions during adaptive DEM scheme applications. The DAC controller 270 may be a separate component, external to the DAC 200, as shown in the example implementation depicted in FIG. 2 for example. The disclosure is not so limited, however, and the DAC controller 270 may be incorporated into the DAC 200 (or even the DEM block 210 itself), and/or at least some of the functions described with respect to the DAC controller 270 may be performed by existing circuitry in the DAC 200 (or by the DEM block 210 itself).

The DEM block 210 may be implemented based on a tree-structure. For example, in the example implementation shown in FIG. 2, the DEM block 210 is implemented as 8-level unity-weighted DAC with tree-structured DEM encoding. In this regard, inputs to the DEM block 210 may $b_2$, $b_1$, $b_0$ and $b_b$ may be input binary bits, as defined in, for example, Table 1, where $b_0$ and $b_b$ are both LSBs.

TABLE 1

DAC Input Level vs. Bits

| Input Level | $b_2b_1b_0b_b$ |
|---|---|
| 0 | 0000 |
| 1 | 0010 |
| 2 | 0100 |
| 3 | 0110 |
| 4 | 1000 |
| 5 | 1010 |
| 6 | 1100 |
| 7 | 1110 |
| 8 | 1111 |

For example, in the example implementation depicted in FIG. 2, DEM block 210 may comprise switching blocks: 220, $230_1$, $230_2$, and $240_1$ through $240_4$. In this regard, each switching block may comprise suitable circuitry for performing a particular switching sequence, based on inputs to the switching block. For example, the switching sequences $S_{11}$, $S_{11}$, $S_{21}$, $S_{22}$, $S_{31}$, $S_{32}$, $S_{33}$ and $S_{34}$ (corresponding to switching performed via the switching blocks 220, $230_1$, $230_2$, and $240_1$ through $240_4$) may take a value of 0 or 1 (e.g., based on values of binary inputs $b_2$, $b_1$, $b_0$ and $b_b$, and/or outputs of prior switching blocks within the tree), to generate outputs $c_1$, $c_2$, ..., $c_8$ which may be the control signals to the 8 unity-weighted DAC elements $250_1$ through $250_8$.

The switching sequences used in an example DEM scheme in accordance with the present disclosure are shown in Table 2. In this regard, information corresponding to the switching sequences in accordance with the scheme may be maintained in the DAC controller 270, and used to set and/or adjust various components of the DEM block 210 when providing dynamic element matching. For example, when the input signal is at full-scale, the switching sequences take $r_1$, $r_2$ or $r_3$, which are pseudo-random numbers with a value of 0 or 1. In this mode, the scheme works exactly the same way as a conventional DEM encoder. When the input signal is backed off from the full-scale (e.g., by 6 dB or 12 dB), some of the switching sequences may be constrained to certain values, such as based on the input bits. Thus, some of the DAC elements $250_1$ through $250_8$ are forced not to switch. The switching sequences may also be adjusted to accommodate input signals with various DC levels.

TABLE 2

Switching Sequences Based on DAC Input Amplitude and DC Level

| Input Amplitude (dBFS) | Input DC Level | $S_{11}$ | $S_{21}$ | $S_{22}$ | $S_{31}$ | $S_{32}$ | $S_{33}$ | $S_{34}$ |
|---|---|---|---|---|---|---|---|---|
| 0 | Any | $r_1$ | $r_2$ | $r_2$ | $r_3$ | $r_3$ | $r_3$ | $r_3$ |
| −6 | 2 | $r_1$ | $r_2$ | $r_2$ | $b_2$ | $b_2$ | $b_2$ | $b_2$ |
| −6 | 4 | $r_1$ | XNOR($b_1$, $b_2$) | XNOR($b_1$, $b_2$) | $b_2$ | $r_3$ | $b_2$ | $r_3$ |
| −6 | 6 | $r_1$ | $r_2$ | $r_2$ | $b_2$ | $b_2$ | $b_2$ | $b_2$ |
| −12 | 1 | $r_1$ | $b_1$ | $b_1$ | $b_2$ | $b_2$ | $b_2$ | $b_2$ |
| −12 | 2 | XNOR($b_0$, $b_1$) | $b_1$ | $r_2$ | $b_2$ | $b_2$ | $b_2$ | $b_2$ |
| −12 | 3 | $r_1$ | $b_1$ | $b_1$ | $b_2$ | $b_2$ | $b_2$ | $b_2$ |
| −12 | 4 | XNOR($b_0$, $b_2$) | XNOR($b_1$, $b_2$) | XNOR($b_1$, $b_2$) | $b_2$ | $b_2$ | $b_2$ | $r_3$ |
| −12 | 5 | $r_1$ | $b_1$ | $b_1$ | $b_2$ | $b_2$ | $b_2$ | $b_2$ |
| −12 | 6 | XNOR($b_0$, $b_1$) | $b_1$ | $r_2$ | $b_2$ | $b_2$ | $b_2$ | $b_2$ |
| −12 | 7 | $r_1$ | $b_1$ | $b_1$ | $b_2$ | $b_2$ | $b_2$ | $b_2$ |

In some instances, localized DEM schemes may incorporate digital back-off (e.g., presume the highest/lowest levels will not be reached), not dynamically on a per-sample basis. In this regard, handling on back-off may be useful for certain standards, such as, e.g., DOCSIS and MoCA standards since back off in the power amplifier may not be allowed.

In some instances, localized DEM schemes may be set and/or adjusted (e.g., by the DAC controller 270) based on signal characteristics, such as signal peak-to-average power ratio (PAPR). For example, digitally set gain/swing localization may be set and/or adjusted depending on the signal's peak-to-average power ratio (PAPR).

In some instances, localized DEM schemes may be extended to DACs with more levels and more bits, and may also be applied to DACs with segmented structures (e.g., DACs employing both unity-weighted elements and binary-weighted elements).

Figure 3:
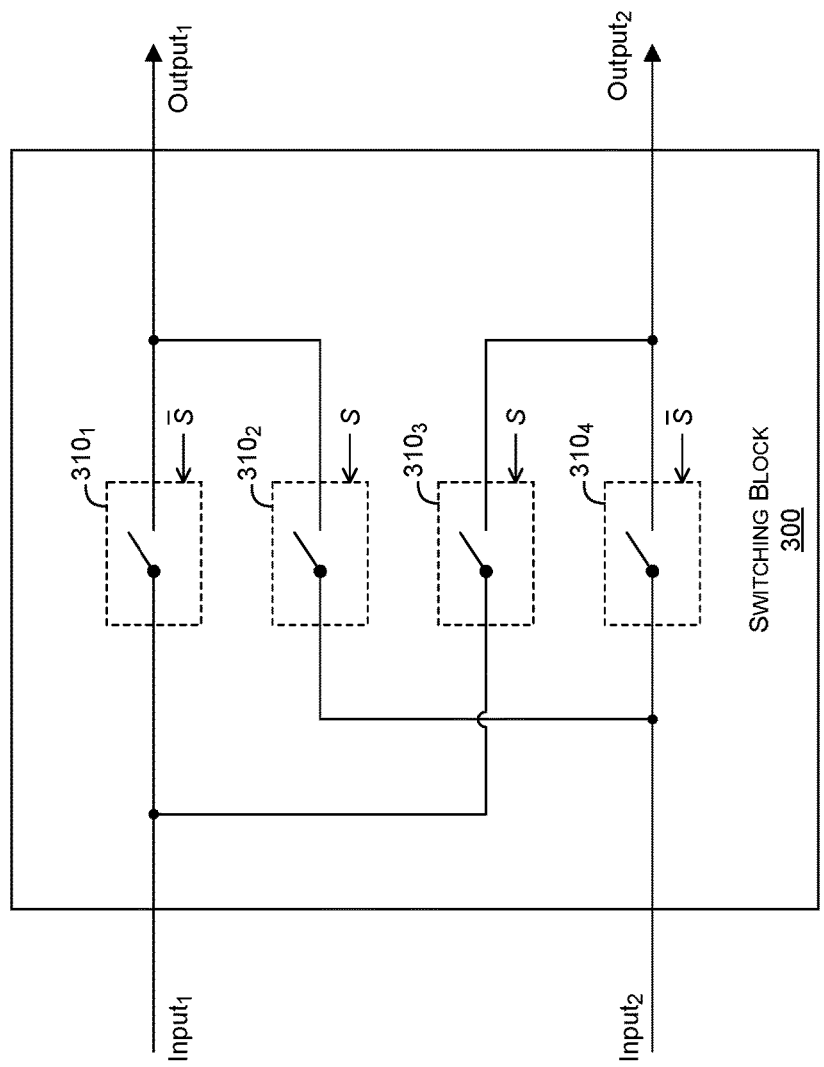
FIG. 3 illustrates an example switching block, for use in tree-structured dynamic element matching (DEM) blocks.

FIG. 3 illustrates an example switching block, for use in tree-structured dynamic element matching (DEM) blocks. Referring to FIG. 3, there is shown a switching block 300.

The switching block 300 may comprise suitable circuitry for applying a particular switching sequence (e.g., between a plurality of inputs and a plurality of outputs), such as based on inputs to the switching block 300. The switching block 300 may correspond to each of the switching blocks 220, $230_1$, $230_2$, and $240_1$ through $240_4$ of FIG. 2.

As shown in the example use scenario depicted in FIG. 3, the switching block 300 may be configured to, for example, switch between two inputs ($input_1$ and $input_2$) and two outputs ($output_1$ and $output_2$). In this regard, the switching block 300 may comprise four switching elements $310_1$-$310_4$, each of which being configurable to switch (on/off), thus establishing (or not) input-output pair connection. The switching elements $310_1$-$310_4$ may be controlled, for example, using control signals (e.g., provided by a control logic, such as the DAC controller 270 of FIG. 2).

Accordingly, the switching (sequence) related operations may be adjusted by, for example, modifying the control signals used for each switching element $310_i$. An example control arrangement is shown in FIG. 3, in which the switching elements $310_1$-$310_4$ are controlled based on a switching sequence (S) associated with the switching block and its inverse (S̄). Accordingly, the switching block 300 may be used to steer the two inputs ($input_1$ and $input_2$) in one of two ways—e.g., $input_1$ to $output_2$ and $input_2$ to $output_1$ for S, and $input_1$ to $output_1$ and $input_2$ to $output_2$ for S̄.

Figure 4:
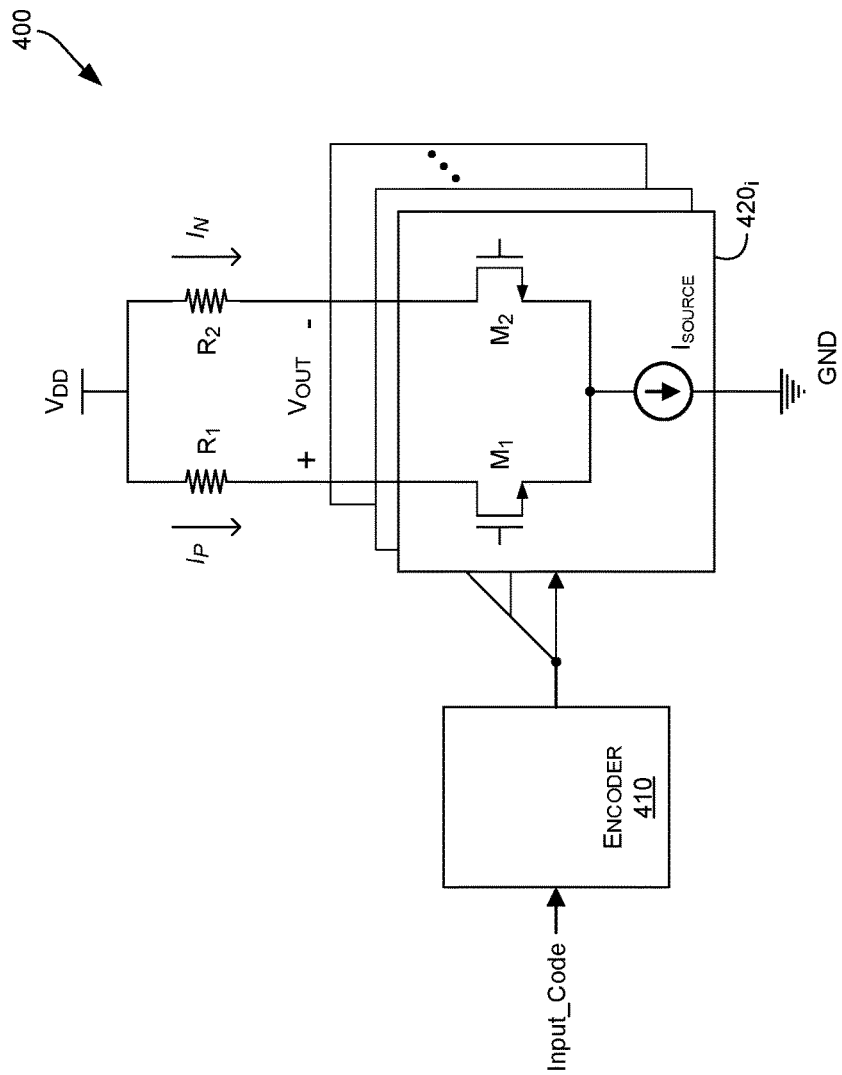
FIG. 4 illustrates an example current-steering digital-to-analog convertor (DAC).

FIG. 4 illustrates an example current-steering digital-to-analog convertor (DAC). Referring to FIG. 4, there is shown a digital-to-analog convertor (DAC) 400.

The DAC 400 may comprise suitable circuitry for performing digital-to-analog conversions. The DAC 400 may correspond to, for example, the DAC 400, substantially as described with respect to FIG. 4. For example, the DAC 400 may be utilized, for example, during signal processing, such as to allow converting digital data into analog waveforms. The disclosure, however, is not limited to any particular use scenario, and may be utilized in any appropriate setup performing or requiring digital-to-analog conversions.

In the example implementation shown in FIG. 4, the DAC 400 may comprise a plurality of DAC cells $420_i$, corresponding to an array of current sources ($I_{SOURCE}$). Current from each current source $I_{SOURCE}$ (of each DAC cell $420_i$) may be steered to either side of a differential load (e.g., the differential load provided by a pair of resistors $R_1$ and $R_2$), via two corresponding switching branches. The switching branches may comprise a pair of transistors $M_1$ and $M_2$ (one in each of the branches) connected to a supply voltage ($V_{DD}$) through the differential load resistors R1 and R2, respectively. The transistors $M_1$ and $M_2$ may be NMOS transistors. The disclosure is not so limited, however, and other types of transistors (e.g., PMOS transistors, CMOS transistors, etc.) may be used. The DAC 400 may also comprise an encoder 410, which may comprise suitable circuitry for generating control signals to the current-steering cells, such as based on input code (e.g., the digital code being converted).

Accordingly, during operations of the DAC 400, two currents may flow through each DAC cell $420_i$, a negative-side current ($I_N$) and positive-side current ($I_P$), corresponding to the negative and positive sides of the output signal, respectively. The load within each DAC cell $420_i$ may be differentially adjusted in each side, thus resulting in adjustment of the values of $I_N$ and $I_P$. The DAC 400 may be adapted to generate control signals to the current-steering DAC cells based on the input code (e.g., the digital code being converted). The control signals may control, for example, the transistors M1 and M2, which in turn may control (or adjust) the values of the currents $I_N$ and $I_P$ in each DAC cell $420_i$.

Figure 5:
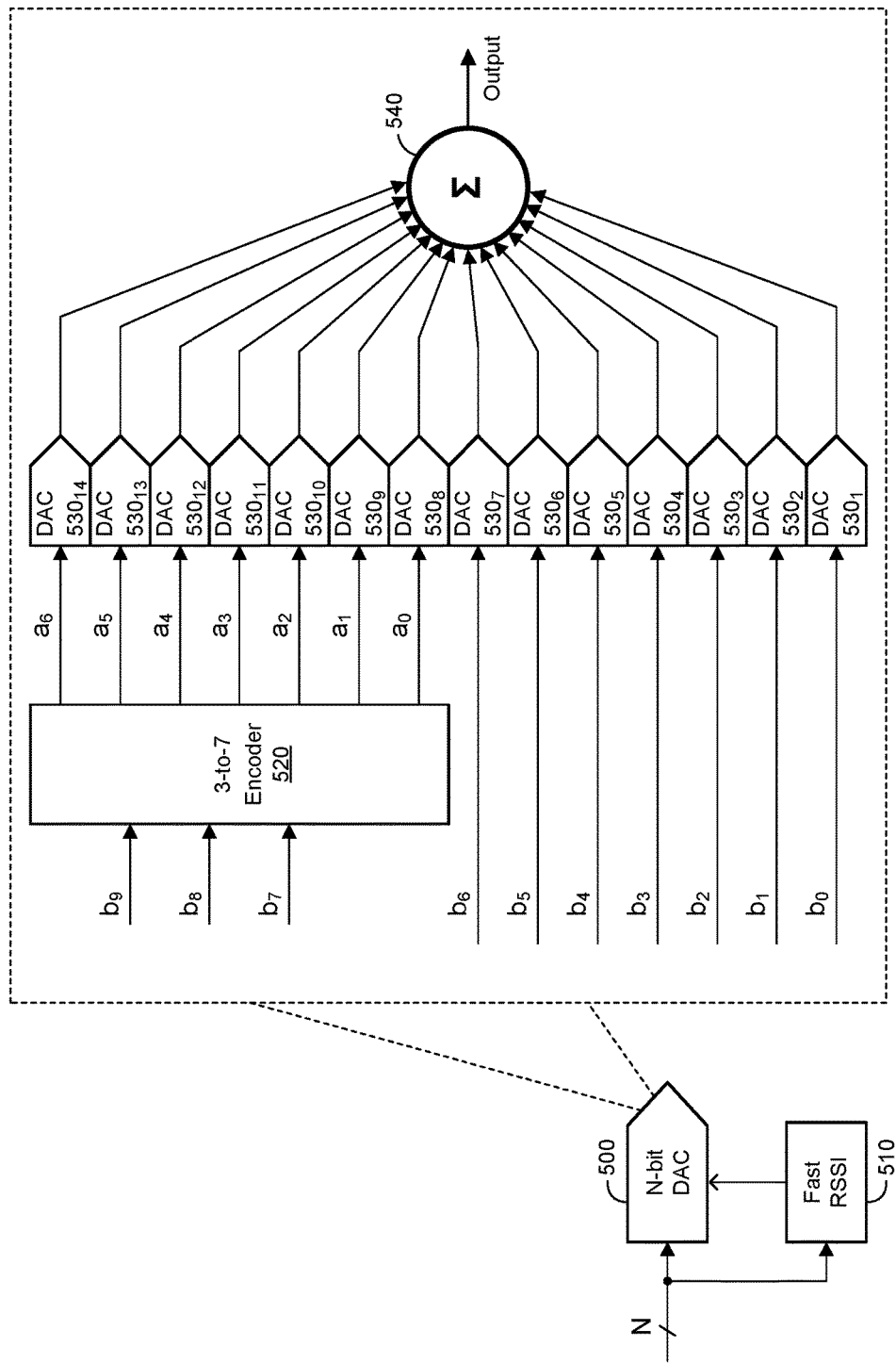
FIG. 5 illustrates an example current-steering digital-to-analog convertor (DAC) with dynamic noise scaling.

FIG. 5 illustrates an example current-steering digital-to-analog convertor (DAC) with dynamic noise scaling. Referring to FIG. 5, there is shown a digital-to-analog convertor DAC 500 and a fast radio signal strength indicator (RSSI) block 510.

The DAC 500 may comprise suitable circuitry for performing digital-to-analog conversions. The DAC 500 may correspond to, for example, the DAC 100, substantially as described with respect to FIG. 1. For example, the DAC 500 may be utilized during signal processing, such as to allow converting digital data into analog waveforms. The disclosure, however, is not limited to any particular use scenario, and may be utilized in any appropriate setup performing or requiring digital-to-analog conversions.

The DAC 500 may be adapted to provide digital-to-analog conversions based on current-steering, substantially as described with respect to the DAC 400 of FIG. 4 for example. The DAC 500 may additionally be configured and/or implemented to support dynamic noise scaling. In this regard, the dynamic noise scaling may be achieved by turning off portions (e.g., DAC elements) in the DAC block under certain conditions.

For example, in the example implementations depicted in FIG. 5, the DAC 500 may be implemented as 10-bit DAC, converting 10-bit digital inputs to corresponding analog outputs. In particular, the DAC 500 may be implemented and/or configured with 3+7 segmentation to support dynamic noise scaling, with the top 3 bits (b7 through b9) being thermometer-coded (e.g., via an encoder 520) while the lower 7 bits (b0 through b6) are simply binary-coded. The encoder 520 may comprise suitable circuitry for encoding at least some of the DAC inputs. Furthermore, the number of outputs of the encoder 520 may differ from number of inputs thereto. For example, as shown in FIG. 5, the encoder 520 may be configured as 3-to-7 thermo encoder. In this regard, the encoder 520 may be operable to generate 7-bit thermo code (a0 through a6) based on the 3 bit-input (corresponding to input bits b7 through b9).

The D/A conversions in the DAC 500 may be performed via a plurality of DAC elements $530_1$-$530_N$, the outputs of which may be combined via an adder block 540. For example, in the implementation shown in FIG. 5, the DAC 500 may comprise 14 DAC elements (DAC elements $530_1$-$530_{14}$), with the inputs of the first seven corresponding to the low 7 input bits (b0 through b6) and the inputs of the second seven corresponding to the 7-bit output of the 3-to-7 thermo encoder (a0 through a6), which are generated based on the top three input bits (b7 through b9). Each of the DAC elements $530_1$-$530_{14}$ may be substantially similar to (or at least incorporate) the current-steering based DAC cells $420_i$ of the DAC 400, as describe with respect to FIG. 4.

The DAC 500 may be operable to provide dynamic noise scaling, during D/A conversions. For example, if the input signal amplitude is low based on particular criteria (e.g., lower than −6 dBFS), certain current sources (e.g., those controlled by a0, a1, a5 and a6) can be turned off or steered away from the output, thus the thermal noise and mismatch noise from those current sources do not show up at the output while the signal power may be still maintained. This may result in noise power scaling dynamically with signal power to improve SNR at weak input signal conditions—hence the name dynamic noise scaling (DNS).

In some implementations, configuring, controlling and/or adjusting operations of the DAC 500 (e.g., to enable dynamic noise scaling) may be done based on the input signals, particularly characteristics thereof. In this regard, characteristics of an input signal may be determined, to enable controlling and/or adjusting operations of the DAC 500 (e.g., dynamic noise scaling). For example, the RSSI block 510 may be utilized to detect change(s) in input signal amplitude and/or power, and/or to particularly do so fast enough—e.g., to enable setting scaling control of the DAC 500.

Figure 6:
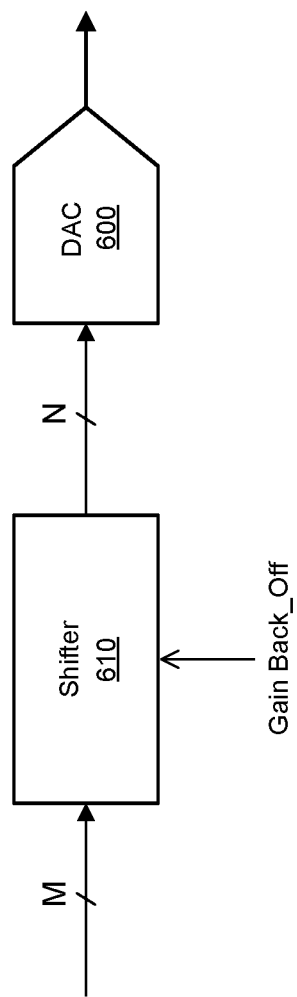
FIG. 6 illustrates an example digital-to-analog convertor (DAC) with dynamic noise scaling and digital gain control.

FIG. 6 illustrates an example digital-to-analog convertor (DAC) with dynamic noise scaling and digital gain control. Referring to FIG. 6, there is shown a digital-to-analog convertor (DAC) 600 and a shifter 610.

The DAC 600 may comprise suitable circuitry for performing digital-to-analog conversions, and to also support dynamic noise scaling. For example, the DAC 600 may be similar to the DAC 500, substantially as described with respect to FIG. 5.

The shifter 610 may comprise suitable circuitry for performing bit shifting. For example, the shifter 610 may be configured to apply right-shifting or left-shifting on codes, and/or to do so with bit insertion (e.g., using predefined values, or based on shifted-out bits). The shifter 610 may be configured adaptively (e.g., the bit shifting performed thereby may be modified, such as based on and/or to enable adjusting operations of the DAC 600).

In operation, dynamic noise scaling may be utilized to implement efficient digital gain control in current steering DACs. For example, in the implementation shown in FIG. 6, the digital input code (pre-shifter) may have M bits while the input of the DAC 600 may have N bits, where N<M. To decrease the gain of the DAC 600, the digital input can be simply right-shifted, via the shifter 610, and the unused current sources in the DAC 600 can be turned off or steered away from the output to scale noise together with signal, so that SNR is not degraded.

Figure 7:
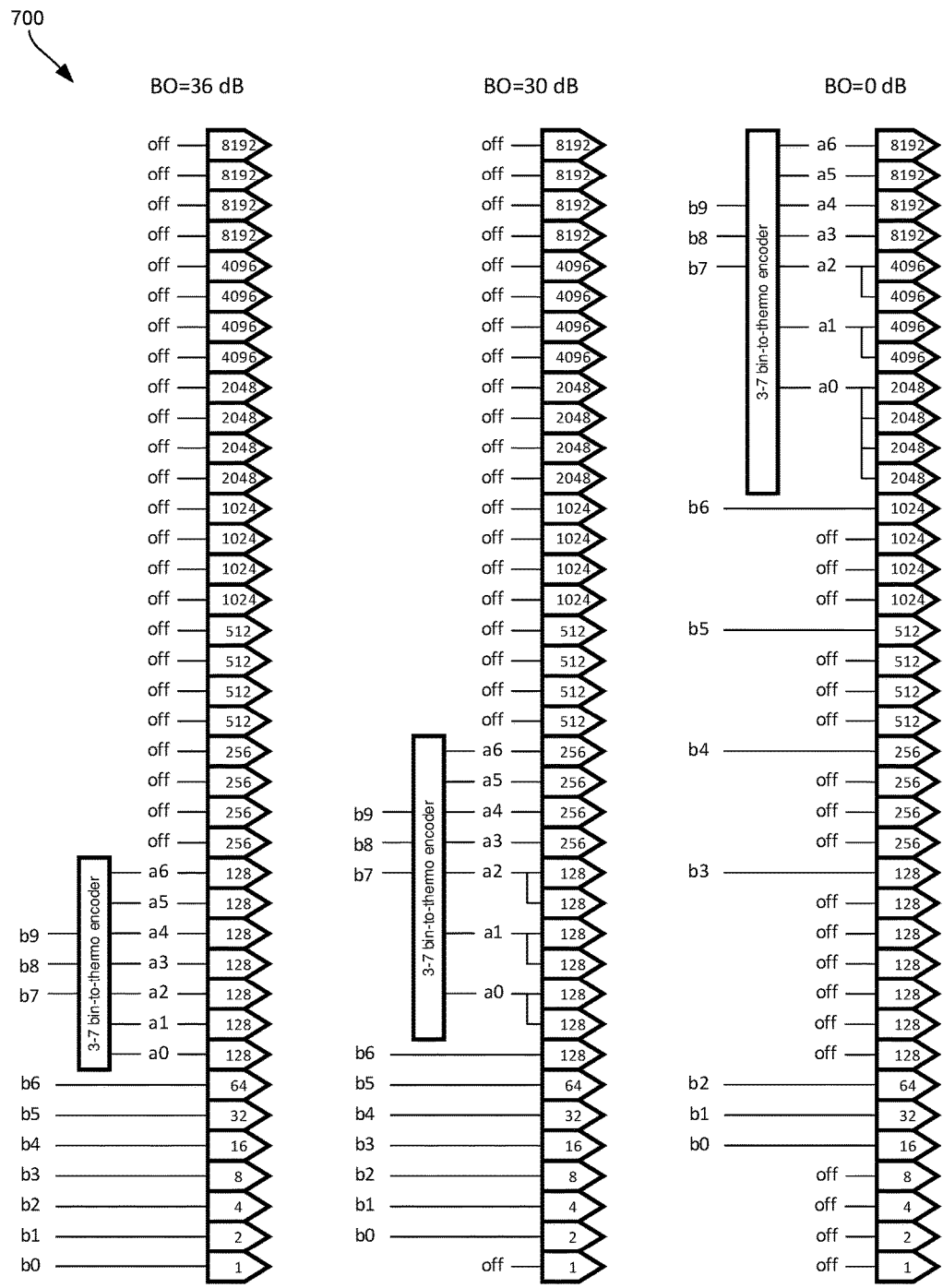
FIG. 7 illustrates an example digital-to-analog convertor (DAC) incorporating a segmentation-based implementation, with support for dynamic noise scaling and digital gain control.

FIG. 7 illustrates an example digital-to-analog convertor (DAC) incorporating a segmentation-based implementation, with support for dynamic noise scaling and digital gain control. Referring to FIG. 7, there is shown a digital-to-analog convertor (DAC) 700.

The DAC 700 may comprise suitable circuitry for performing digital-to-analog conversions, and to also incorporate segmentation based design with support for use of dynamic noise scaling and digital gain control. In this regard, the DAC 700 may be implemented using a segmentation design, substantially as described with respect to DAC 500 of FIG. 1 (e.g., 3+7 segmentation in the example implementation depicted in FIG. 7). Further, the DAC 700 may incorporate dynamic noise scaling (DNS) and digital gain control, substantially as described with respect to the DAC 600 of FIG. 6 (e.g., with N=10 and M=16 in the example implementation depicted in FIG. 7). Accordingly, the DAC 700 may provide, based on the various design aspects incorporated therein, 36 dB of gain back-off while maintaining the quantization noise, thermal noise and mismatch noise at 10-bit level. Further, the 3+7 segmentation may be maintained throughout the 36 dB of gain range.

Figure 8:
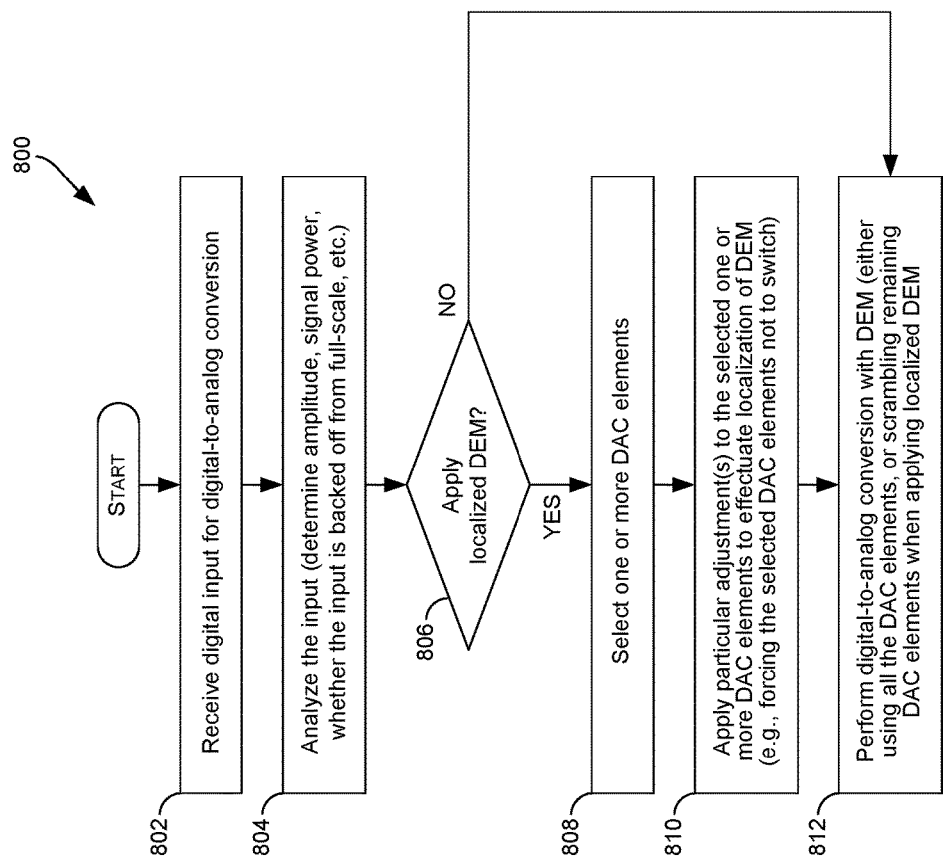
FIG. 8 is a flowchart illustrating an example process for applying localized dynamic element matching during digital-to-analog conversions.

FIG. 8 is a flowchart illustrating an example process for applying localized dynamic element matching during digital-to-analog conversions. Referring to FIG. 8, there is shown a flow chart 800, comprising a plurality of example steps.

In step 802, a digital input is received for application of digital-to-analog conversion thereto.

In step 804, the received input may be analyzed (e.g., to determine amplitude, signal power, whether the input is backed off from full-scale, etc.).

In step 806, it may be determined whether or not to apply localized dynamic element matching (DEM). For example, the determination may be based on whether (or not) the input signals is backed off from full-scale. In instances where it may be determined to apply, the process may proceed to step 808; otherwise the process may jump to step 812.

In step 808, one or more DAC elements may selected for use in the application of the localized DEM. The selection may be made, for example, indirectly or implicitly. For example, in instances where the DAC incorporates a switching arrangement, various switching sequences may be setup for each switching elements based on conditions relating to the input (e.g., as analyzed in step 804). Thus, the selection of the elements may be done by setting appropriate switching sequences for the particular conditions.

In step 810, particular adjustment(s) may be applied to the selected one or more DAC elements to effectuate localization of DEM (e.g., forcing the selected DAC elements not to switch).

In step 812, digital-to-analog conversion with DEM may be applied (either using all the DAC elements, when localized DEM is not performed, or by scrambling remaining DAC elements when applying localized DEM).

Figure 9:
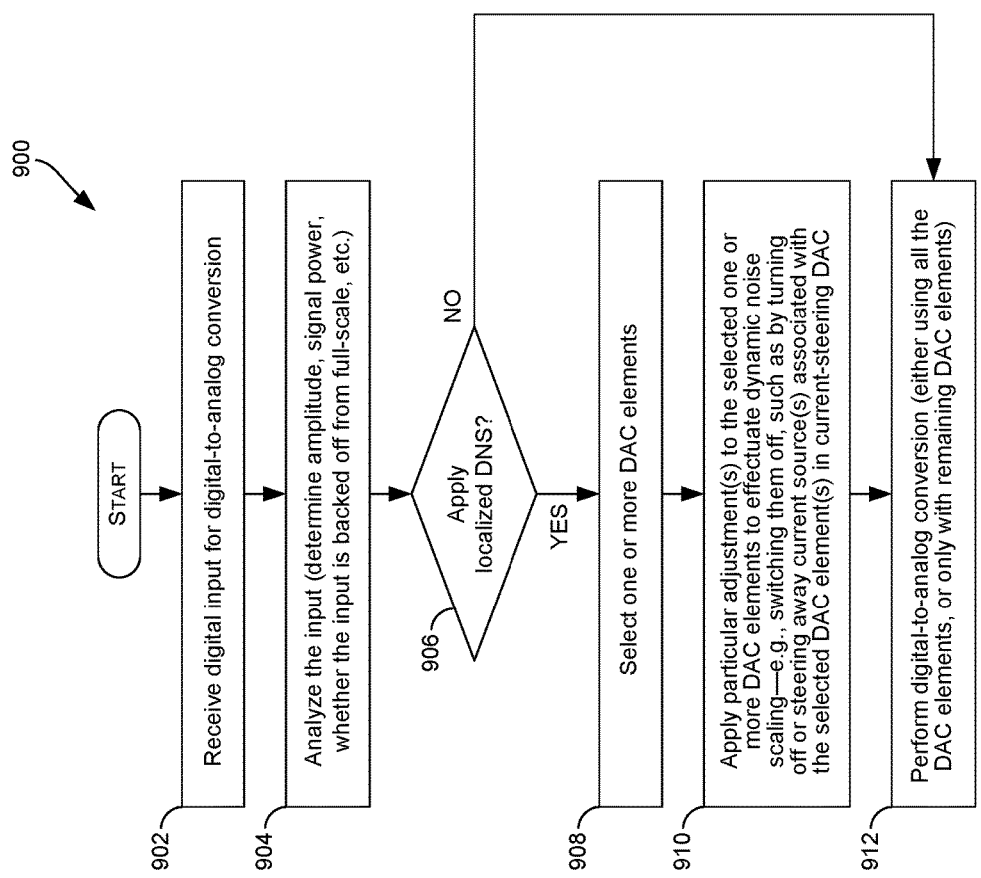
FIG. 9 is a flowchart illustrating an example process for applying dynamic noise scaling during digital-to-analog conversions.

FIG. 9 is a flowchart illustrating an example process for applying dynamic noise scaling during digital-to-analog conversions. Referring to FIG. 9, there is shown a flow chart 900, comprising a plurality of example steps.

In step 902, a digital input is received for application of digital-to-analog conversion thereto.

In step 904, the received input may be analyzed (e.g., to determine amplitude, signal power, whether the input is backed off from full-scale, etc.).

In step 906, it may be determined whether or not to apply dynamic noise scaling (DNS). For example, the determination may be based on the amplitude of the input signal (e.g., when the input signal amplitude is lower than −6 dBFS). In instances where it may be determined to apply, the process may proceed to step 908; otherwise the process may jump to step 912.

In step 908, one or more DAC elements may selected for use in the application of the DNS.

In step 910, particular adjustment(s) may be applied to the selected one or more DAC elements to effectuate dynamic noise scaling—e.g., switching them off, such as by turning off or steering away current source(s) associated with the selected DAC element(s) in current-steering DAC.

In step 912, digital-to-analog conversion may be applied (either using all the DAC elements, or with only remaining DAC elements when applying DNS).

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for non-intrusive noise cancellation.

Accordingly, the present method and/or system may be realized in hardware, software, or a combination of hardware and software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein. Another typical implementation may comprise an application specific integrated circuit or chip.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form. Accordingly, some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A system, comprising:
  a digital-to-analog converter (DAC) that comprises:
    an encoder that generates a multi-bit output based on a multi-bit input, wherein:
      the multi-bit input comprises one or more bits from an input to the DAC; and
      a number of bits in the multi-bit input is two or more and a number of bits in the multi-bit output is greater than the number of bits in the multi-bit input;
    a plurality of first converter elements, wherein each first converter element generates an output according to a single bit of the multi-bit output of the encoder;
    one or more second converter elements, wherein:
      each second converter element generates an output according to a single bit; and
      at least one second converter element receives at least one remaining bit in the input to the DAC that is not included in the multi-bit input to the encoder; and
    a combiner that generates a combined output based on combining outputs from the plurality of first converter elements and outputs from the one or more second converter elements.

2. The system of claim 1, wherein the combiner generates the combined output based on combining outputs from each of the plurality of first converter elements with outputs from each of the one or more second converter elements.

3. The system of claim 1, wherein the relationship between the multi-bit input and the multi-bit output of the encoder is adaptive.

4. The system of claim 1, wherein the encoder operates to select one or more of the plurality of first converter elements.

5. The system of claim 4, wherein the selected one or more of the plurality of first converter elements are allowed to switch.

6. The system of claim 4, wherein the selected one or more of the plurality of first converter elements are allowed to switch in according to a pseudo-random sequence.

7. The system of claim 1, wherein the combiner comprises an adder.

8. The system of claim 1, wherein the encoder is operable to generate the multi-bit output as a thermo code.

9. The system of claim 1, comprising a detector that detects one or more parameters or conditions associated with the multi-bit input.

10. The system of claim 9, wherein operations or functions of the DAC are adjusted or controlled based on the detected one or more parameters or conditions associated with the multi-bit input.

11. The system of claim 9, wherein the one or more parameters or conditions comprise signal amplitude and power.

12. The system of claim 9, wherein the detector comprises a radio signal strength indication (RSSI) based circuit.

* * * * *